United States Patent
Dias et al.

(10) Patent No.: US 10,461,007 B2
(45) Date of Patent: Oct. 29, 2019

(54) SEMICONDUCTOR PACKAGE WITH ELECTROMAGNETIC INTERFERENCE SHIELDING

(71) Applicant: INTEL CORPORATION, Santa Clara, CA (US)

(72) Inventors: Rajendra C. Dias, Phoenix, AZ (US); Nachiket R. Raravikar, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/773,639

(22) PCT Filed: Dec. 22, 2015

(86) PCT No.: PCT/US2015/067442
§ 371 (c)(1),
(2) Date: May 4, 2018

(87) PCT Pub. No.: WO2017/111956
PCT Pub. Date: Jun. 29, 2017

(65) Prior Publication Data
US 2018/0323128 A1 Nov. 8, 2018

(51) Int. Cl.
*H01L 23/31* (2006.01)
*H01L 23/552* (2006.01)
(Continued)

(52) U.S. Cl.
CPC ........ *H01L 23/3128* (2013.01); *H01L 21/565* (2013.01); *H01L 21/762* (2013.01);
(Continued)

(58) Field of Classification Search
CPC ....... H01L 23/55; H01L 23/552; H01L 23/31; H01L 23/312; H01L 23/3128; H01L 21/76; H01L 21/762; H01L 21/56; H01L 21/561; H01L 21/565; H01L 21/31; H01L 21/312; H01L 21/3128; H01L 21/02; H01L 21/02; H01L 21/0209; H01L 21/02098
(Continued)

(56) References Cited

U.S. PATENT DOCUMENTS

2015/0108621 A1* 4/2015 Pabst .................... H01L 23/552
257/659

* cited by examiner

*Primary Examiner* — Monica D Harrison
(74) *Attorney, Agent, or Firm* — Eversheds Sutherland (US) LLP

(57) ABSTRACT

Semiconductor packages with electromagnetic interference (EMI) shielding and a method of manufacture therefor is disclosed. The semiconductor packages may house single electronic components or may be a system in a package (SiP) implementation. The EMI shielding may be provided on top of and along the periphery of the semiconductor package. The EMI shielding on the periphery may be formed of cured conductive ink or cured conductive paste disposed on sidewalls of molding that encapsulates the electronic component(s) provided on the semiconductor package. The top portion of the EMI shielding may be a laminated metal sheet provided on a top surface of the molding. The semiconductor package may further have vertical portions of the EMI shielding with conductive ink filled trenches in the molding that may separate one or more electronic components from other electronic components of the semiconductor package.

19 Claims, 7 Drawing Sheets

(51) Int. Cl.
*H01L 25/065* (2006.01)
*H01L 21/56* (2006.01)
*H01L 21/762* (2006.01)
*H01L 21/02* (2006.01)

(52) U.S. Cl.
CPC ........ *H01L 23/552* (2013.01); *H01L 25/0657* (2013.01); *H01L 21/02098* (2013.01); *H01L 21/561* (2013.01); *H01L 25/0655* (2013.01); *H01L 2224/73204* (2013.01)

(58) Field of Classification Search
USPC .......................................................... 257/678
See application file for complete search history.

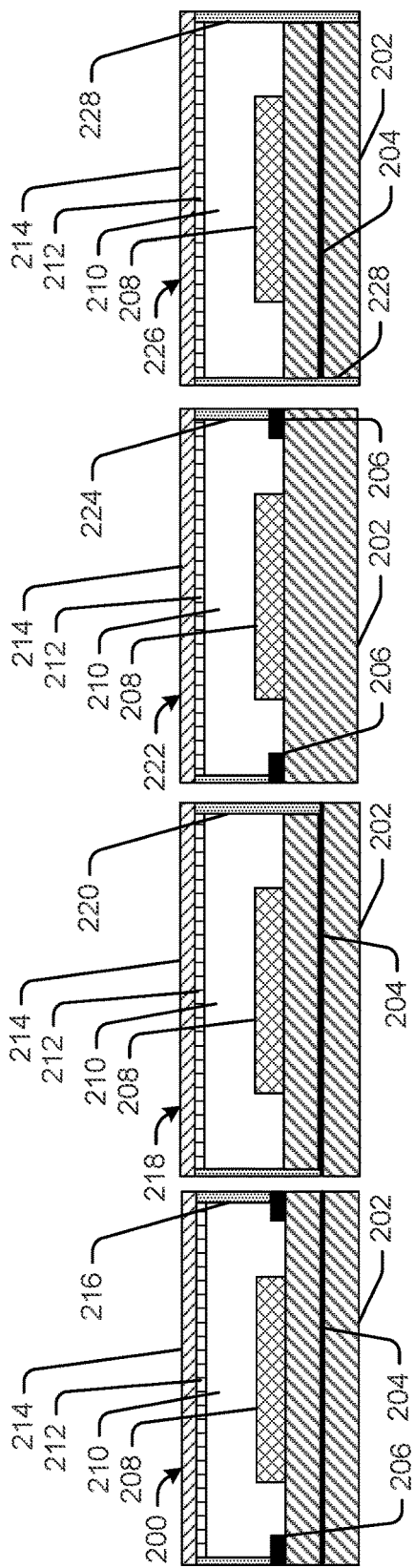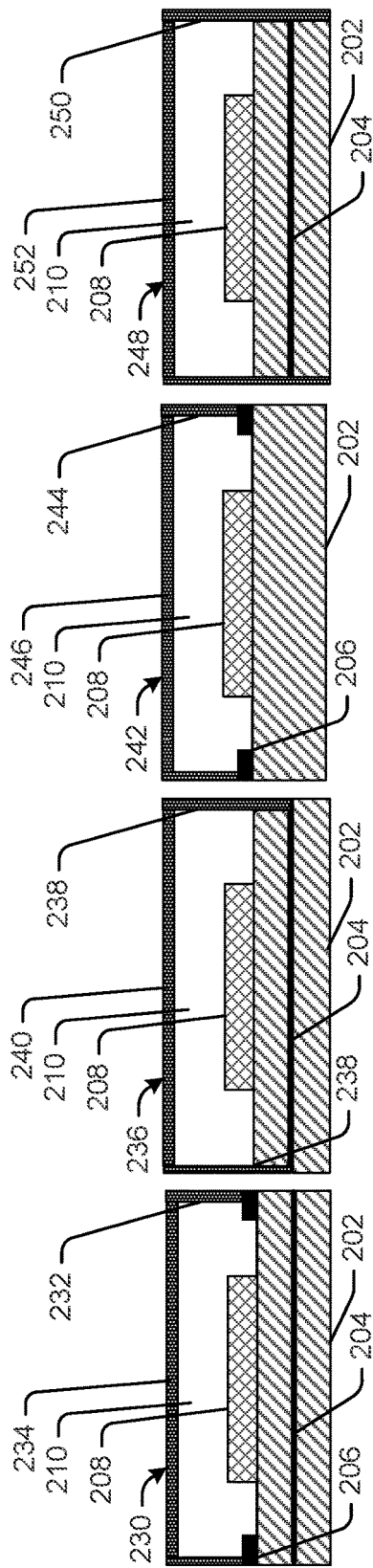

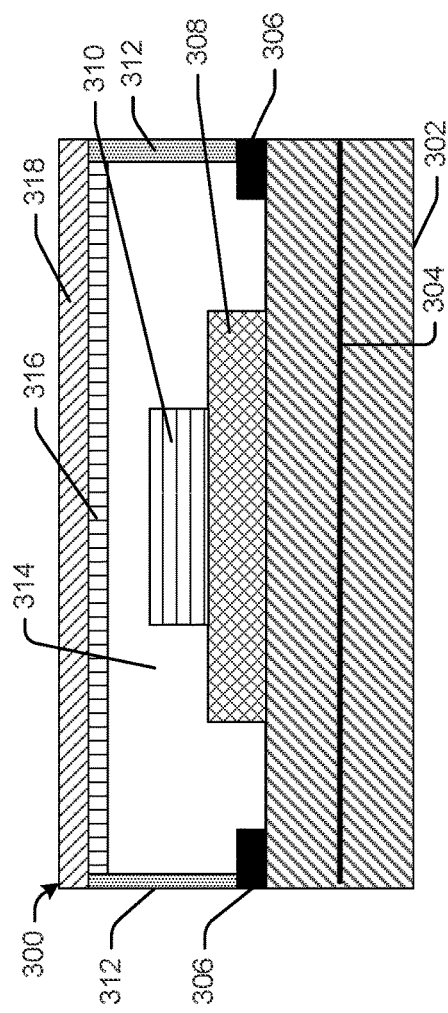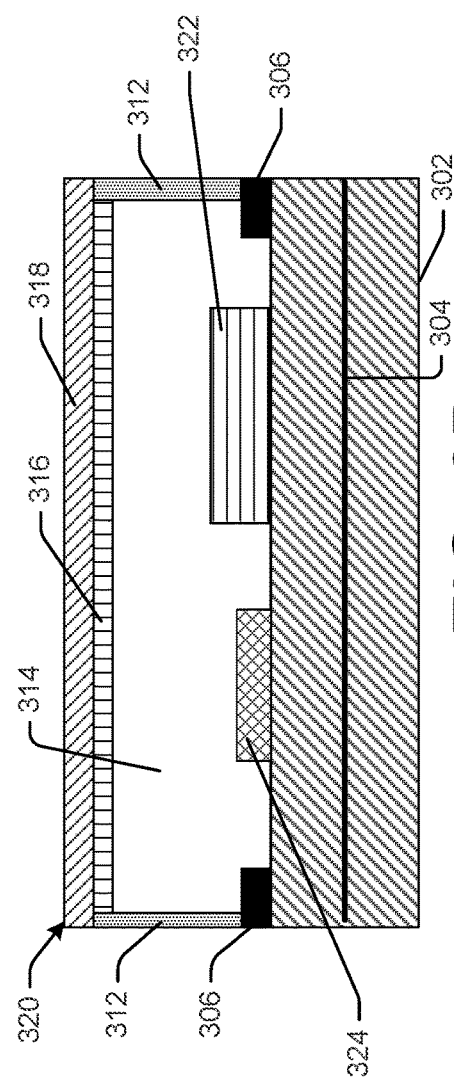

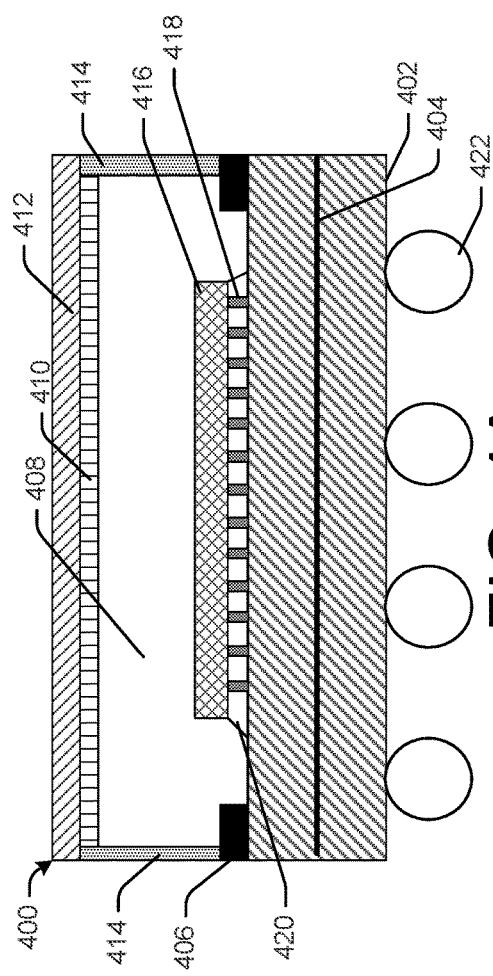
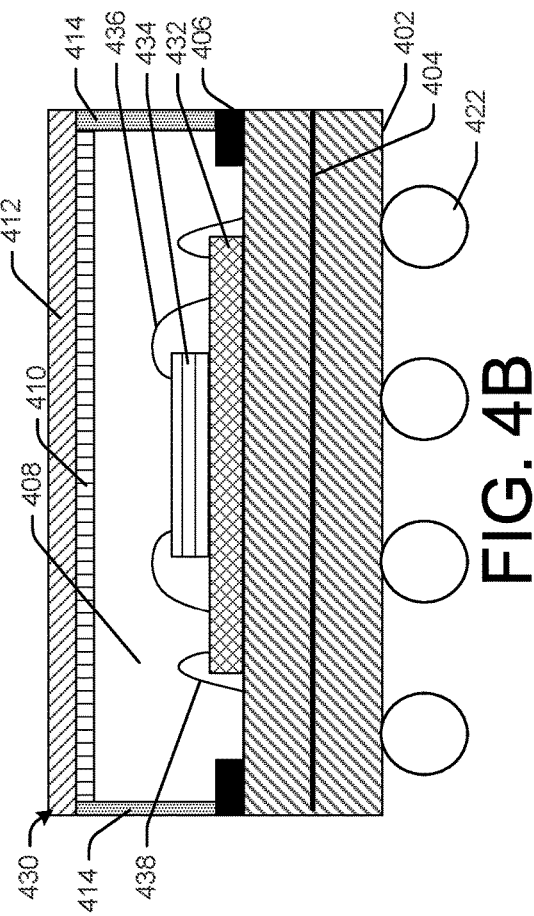
FIG. 4A
FIG. 4B

SEMICONDUCTOR PACKAGE WITH ELECTROMAGNETIC INTERFERENCE SHIELDING

CROSS-REFERENCE TO RELATED APPLICATION(S)

This application is a U.S. National Stage Application under 35 U.S.C. 371 and claims the priority benefit of International Application No. PCT/US15/67442, filed Dec. 22, 2015, which is incorporated herein by reference as if set forth in full.

TECHNICAL FIELD

This disclosure generally relates to semiconductor packages, and more particularly to semiconductor packages with electromagnetic shielding.

BACKGROUND

Integrated circuit(s) and other electronic devices may be packaged on a semiconductor package. The semiconductor package may be integrated onto an electronic system, such as a consumer electronic system. The integrated circuit(s) and/or electronic devices provided on the semiconductor package may interfere with each other or with other electronic components of a system in which the semiconductor package is integrated.

BRIEF DESCRIPTION OF THE FIGURES

Reference will now be made to the accompanying drawings, which are not necessarily drawn to scale, and wherein:

FIGS. 2A-2H depict simplified cross-sectional schematic diagrams illustrating various semiconductor packages with EMI shielding, in accordance with example embodiments of the disclosure.

FIGS. 3A and 3B depict simplified cross-sectional schematic diagrams illustrating semiconductor packages with multiple dies provided therein with EMI shielding, in accordance with example embodiments of the disclosure.

FIGS. 4A and 4B depict simplified cross-sectional schematic diagrams illustrating semiconductor packages having any variety of electrical and mechanical coupling between the die and the semiconductor package having an EMI shield, in accordance with example embodiments of the disclosure.

DETAILED DESCRIPTION OF EMBODIMENTS OF THE DISCLOSURE

Figure 1A:
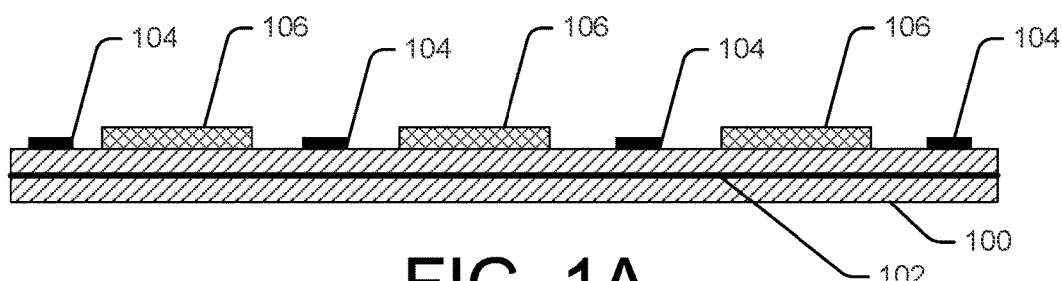
FIGS. 1A-1G depict simplified cross-sectional schematic diagrams of an example semiconductor package with an electromagnetic interference (EMI) shield and fabrication process, in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, materials, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical" as used herein may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or the removal of the material or photoresist as required in forming a described structure.

Embodiments of the disclosure may provide a semiconductor package and a method for fabrication of the semiconductor package. In example embodiments, the semiconductor package may have one or more electromagnetic interference (EMI) shielding structures, as described herein. These semiconductor packages with the EMI shielding structures may be fabricated using the methods as disclosed herein.

In example embodiments, the semiconductor package structures may include a package substrate. In some cases, the package substrate may be an organic structure. In other cases, the package substrate may be inorganic (e.g., ceramic, glass, etc.). The package substrate may, in example embodiments, include a core layer with one or more interconnect layers built up on one or both sides of the core layer. One or more electronic components, including at least one integrated circuit die, may be electrically and mechanically coupled to the package substrate via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connects (C4), anisotropic conductive film (ACF), nonconductive film (NCF), combinations thereof, or the like. Semiconductor package-to-board level interconnects may be provided on one or both sides of the package substrate. In example embodiments, the semiconductor package-to-board level interconnects may be ball grid array (BGA) connections.

The semiconductor package may have a ground layer provided on the surface of the semiconductor package, such as on the top interconnect layer of the semiconductor package. In other cases, the semiconductor package may have a ground plane formed in a layer that is within the package substrate, such as on the package core and/or a build-up layer that is not on the surface of the package substrate. Molding, to mechanically protect the electronic components, may be formed on top of the one or more electronic components on a surface of the semiconductor package. Semiconductor package-to-board level interconnects may be provided on one or both sides of the package substrate.

According to example embodiments, there may be a semiconductor package having trenches within the molding that are filled with conductive material. According to the same or different embodiments, the semiconductor package may further have conductive material on at least a portion of a top surface of the molding material. The conductive material at the top of the molding material and within the trenches may be electrically coupled to each other. In further example embodiments, the conductive material at the top of the molding material and within the trenches of the molding material may be shorted to a ground plane of the semiconductor package. Alternatively, the conductive material at the top of the molding material and within the trenches of the molding material may be shorted to a power plane of the semiconductor package, or otherwise pinned to any other suitable direct current (DC) voltage.

In example embodiments, the semiconductor package may have sidewalls fabricated of cured conductive ink and/or cured conductive paste. In example embodiments, the conductive ink and/or paste may be both provided within channels formed within the molding, as well as on the sidewalls of the semiconductor package. Thus, individual or groups of integrated circuits and/or other electronic components may be surrounded by a trench with conductive material disposed therein, such as to isolate the individual or group of integrated circuits and/or other electronic components from other components in a system in package (SiP) implementation.

The conductive material on top of the semiconductor package may be disposed by laminating a metal sheet (e.g., copper laminate, aluminum laminate, etc.) on top of the semiconductor package molding. In example embodiments, the lamination may be provided on the molding surface with an epoxy between the laminate metal and the molding top surface. In alternative example embodiments, the top conductive layer disposed on the molding top surface may also be formed with cured conductive ink and/or cured conductive paste. In these example embodiments, the top surface conductive material may be substantially the same as the conductive material disposed in trenches of the molding and/or the sidewalls of singulated semiconductor packages. It will be appreciated that multiple semiconductor packages may be formed on a single semiconductor package substrate (e.g., core with build-up layers).

FIGS. 1A-1G depict simplified cross-sectional schematic diagrams of an example semiconductor package with an electromagnetic interference (EMI) shield and fabrication process, in accordance with example embodiments of the disclosure.

The process, as depicted herein, may be implemented to concurrently or nearly concurrently fabricate a plurality of semiconductor packages with EMI shielding. The semiconductor package may be fabricated with any variety of processes or sequences thereof. Although a particular fabrication sequence is shown here with fabrication of various structures and/or features, both final and/or temporary, any variations for fabricating similar features may be implemented in accordance with example embodiments of the disclosure. Further still, there may be additional and/or fewer features than the features disclosed herein for the fabrication of the semiconductor package, in accordance with example embodiments of the disclosure. Although the cross-sections as depicted here show a particular number of semiconductor packages fabricated concurrently on a package substrate panel, it will be appreciated that there may be any number of semiconductor packages that are fabricated concurrently or nearly concurrently on a particular package substrate panel. Additionally, although an example embodiment of the sequence of processes for fabricating a semiconductor package with EMI shielding is depicted, it will be appreciated that there may be any number of package substrate panels that may be processed concurrently and/or near concurrently through any of the processes depicted herein. For example, some processes may be batch processes where a particular unit (e.g., package substrate panel) may be processed along with another of that unit. In other cases, unit processes may be performed in a sequential manner on work-in-progress (WIP).

In FIG. 1A, a schematic cross-section of an example semiconductor package substrate 100 is depicted with a ground plane 102 fabricated within the package substrate 100, in accordance with example embodiments of the disclosure. The semiconductor package substrate 100 may be of any suitable size and/or shape. For example, the semiconductor package substrate 100, in example embodiments, may be a rectangular panel. In example embodiments, the semiconductor package substrate 100 may be fabricated of any suitable material, including polymer material, ceramic material, plastics, composite materials, glass, epoxy laminates of fiberglass sheets, FR-4 materials, FR-5 materials, combinations thereof, or the like. The substrate may have a core layer and any number of interconnect build-up layers on either side of a core layer. The core and/or the interconnect build-up layers may be any variety of the aforementioned materials and, in some example embodiments, may not be constructed of the same material types.

It will be appreciated that the build-up layers may be fabricated in any suitable fashion. For example a first layer of build-up interconnect may include providing a package substrate core, with or without through holes formed therein. Dielectric laminate material may be laminated on the semiconductor substrate core material. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like. Subsequent build-up layers (e.g., higher levels of build-up layers) on either side of the core may be formed by the same aforementioned processes.

The ground plane 102 may be, in example embodiments, a build-up layer (e.g., a build-up layer with interconnects) within the semiconductor package substrate 100. When the final package substrate with the EMI shielding is in operation, the ground plane may be shorted to ground, such as on a printed circuit board (PCB) on which the final package substrate with EMI shielding is disposed. The ground plane may be electrically connected, in example embodiments, to one or more surface ground pads 104. The surface ground pads 104 may be one or more pads and/or interconnect traces (e.g., surface wiring traces) on the top surface of the semiconductor package substrate 100.

The semiconductor package substrate 100 may have one or more electronic components or devices 106 disposed thereon. Although for illustrative purposes, only one electronic component 106 per semiconductor package substrate 100 is depicted in FIGS. 1A-1G, it will be appreciated that there may be any suitable number of electronic components 106 disposed in each semiconductor package with EMI shielding, in accordance with example embodiments of the disclosure. The electronic components 106 may be any suitable electronic components 106 including, but not limited to, integrated circuits, surface mount devices, active devices, passive devices, diodes, transistors, connectors, resistors, inductors, capacitors, microelectromechanical systems (MEMSs), combinations thereof, or the like. The electronic components 106 may be electrically and mechanically coupled to the semiconductor package substrate 100 via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connects (C4), anisotropic conductive film (ACF), nonconductive film (NCF), combinations thereof, or the like.

Figure 1B:
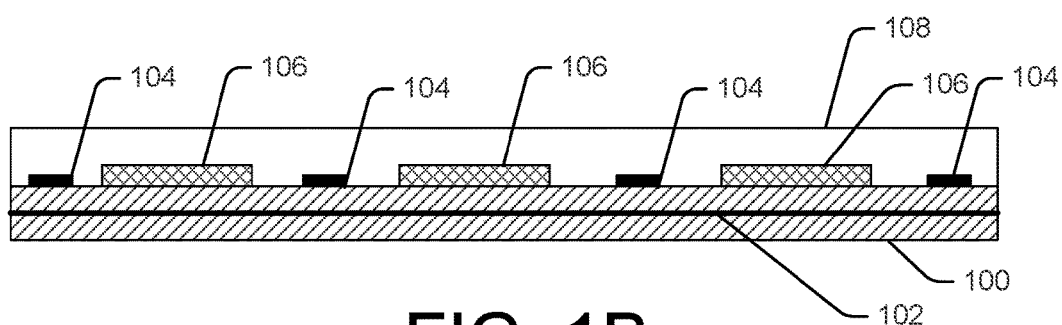

In FIG. 1B, a schematic cross-section of the example semiconductor package substrate 100 of FIG. 1A is depicted with molding 108 provided thereon, in accordance with example embodiments of the disclosure. The molding 108 may be disposed on the top surface of the package substrate and may encapsulate the surface ground pads 104 and/or the electronic components 106 disposed on the surface of the semiconductor package substrate 100. The molding material may be any suitable molding material. For example, the molding material may be a liquid dispensed thermosetting epoxy resin molding compound. The molding compound may be deposited on the surface of the semiconductor package substrate 100 using any suitable mechanism including, but not limited to, liquid dispense, spin coating, spray coating, combinations thereof, or the like.

The molding compound, after being dispensed onto the top surface of the semiconductor package substrate 100, may be cured while pressure is applied thereon by a chase surface. In example embodiments, the chase (e.g., a relatively flat surface pressed on top of the liquid molding material disposed on top of the semiconductor package substrate 100) may itself be heated. Upon curing (e.g., cross-linking) the deposited molding compound may harden and form molding 108 to adhere to the semiconductor package substrate 100 and encapsulating the electronic components 106. In example embodiments, the molding 108 may have fillers and/or other materials therein to preferentially control the coefficient of thermal expansion (CTE), reduce stresses, impart flame retardant properties, promote adhesion, and/or reduce moisture uptake in the molding 108.

The molding 108, in example embodiments, may be any suitable thickness. For example, the molding 108 may be approximately 1 millimeter (mm) thick. In other cases, the molding 108 may be approximately in the range between about 200 microns (μm) and 800 μm thick. In yet other cases, the molding 108 may be approximately in the range between about 1 mm and 2 mm thick.

Figure 1C:
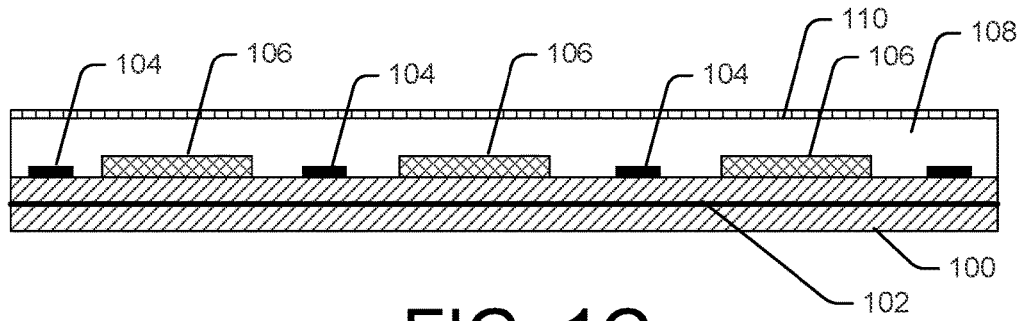

In FIG. 1C, a schematic cross-section of the example semiconductor package substrate 100 with molding 108 of FIG. 1B is depicted with an epoxy 110 deposited thereon, in accordance with example embodiments of the disclosure. The epoxy 110 may be any suitable epoxy that may adhere to the top surface of the molding and to a laminated metal sheet. In example embodiments, the epoxy 110 may be any suitable curable epoxy. In example embodiments, the epoxy 110 may be a stage B epoxy. In these examples, the epoxy material may be deposited, such as by liquid dispense, spin dispense, or spray dispense, and then B staging may be performed, such as by partially removing solvents from the stage B material. The staging process may be performed by a partial heat, light, and/or ultraviolet (UV) process.

Figure 1D:
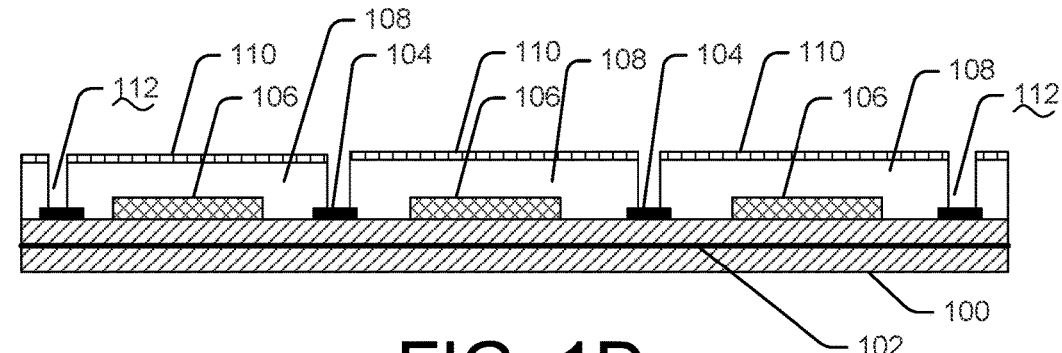

In FIG. 1D, a schematic cross-section of the example semiconductor package substrate 100 with epoxy 110 on top of the molding 108 of FIG. 1C is depicted with trenches 112 formed in the molding 108, in accordance with example embodiments of the disclosure. The trenches 112 may be formed in locations where vertical portions of the EMI shielding is to be formed, optionally including the semiconductor package sidewalls, on the final semiconductor packaging with EMI shielding. The trenches may be formed by any variety of suitable processes, such as light amplification by stimulated emission of radiation (laser) ablation, dry etching, embossing, plasma etching, and/or wet etching. In laser ablation processes, a laser frequency and laser power may be selected such that there is a relatively efficient transference of energy to the molding 108 for relatively effective ablation of the B stage epoxy 110 and the molding 108. The width of the trenches 112 may be any suitable width. In example embodiments, the trenches 112 may be approximately the kerf width of a saw blade that is eventually used to saw and/or singulate the semiconductor package substrate 100 to form each of the semiconductor packages with EMI shielding, in accordance with example embodiments of the disclosure. In other example embodiments, the trenches 112 may be wider than the kerf of the saw that is eventually used to singulate the individual semiconductor packages. In some cases, the trenches 112 may be approximately 500 μm in width. In other cases, the trench 112 widths may be approximately in the range of about 100 μm to 500 μm.

In example embodiments, the trenches 112 may be formed such that the bottom of the trenches open up to the surface ground pads and/or traces 104. In some example embodiments, each non-contiguous section of the trenches 112 may be opened to at least one surface ground pad 104, so that all sections of the final EMI shielding may be grounded. In some example embodiments, the mechanism (e.g., laser ablation, etching, etc.) used for opening up the trenches 112 may be selective in removing the molding material relative to the material (e.g., copper, aluminum, etc.) of the surface ground pad 104.

In some example embodiments, the formation of the trenches 112 may entail an initial removal of molding material, followed by a cleaning of the trenches 112. The initial removal of the molding material may be by any suitable process (e.g., laser ablation, photolithography, dry etching, wet etching, embossing, etc.). This initial removal may, in example embodiments, leave residue (e.g., molding residue, etch by-product residue, etc.). The subsequent cleaning process may also be any suitable process (e.g., laser ablation, photolithography, dry etching, wet etching, embossing, etc.). In example embodiments, the initial removal process may be a different type of process (e.g., laser ablation, photolithography, dry etching, wet etching, embossing, etc.) than the subsequent cleaning process. For example, a laser ablation initial removal process may be followed by a flash wet etch process to form the trenches 112. In other example embodiments, the initial removal process may be the same type of process as the subsequent cleaning process, but with different parameters. For example, a high powered laser ablation process may be followed by a lower power laser ablation process. In yet further example embodiments, the initial removal process may be the same as a subsequent process. Of course, in example embodiments, there may be any number of sequential processes (e.g., three laser ablation processes, followed by a wet etch process) to remove the full depth of the molding material for the trenches 112.

Figure 1E:
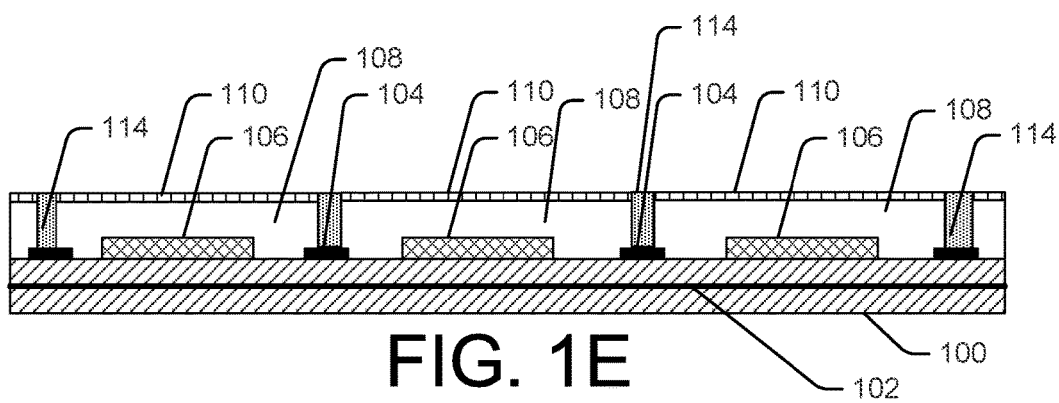

FIG. 1E depicts a schematic cross-section of the example semiconductor package substrate 100 with the trenches 112 in the molding 108 of FIG. 1D as filled with conductive ink and/or conductive paste, in accordance with example embodiments of the disclosure. The conductive ink 114, such as conductive paste, may be dispensed on the surface of the epoxy 110 and may subsequently fill the trenches 112. The conductive ink 114 may be disposed in the epoxy 110 surface by spin deposition, spray deposition, screen printing, squeegee process, and/or any other suitable deposition process. In example embodiments, the conductive ink 114 may wet the molding material and, therefore, may fill the trenches 112 driven by Van der Waals forces and/or capillary action. In the same or other example embodiments, the conductive ink 114 may be forced into the trenches 112 by mechanical force, such as by a squeegee process. In yet other example embodiments, the conductive ink 114 may be preferentially deposited using a screen printing process, such as by aligning a patterned screen on top of the surface of the molding 108 and the epoxy 110.

The conductive ink 114 may be an epoxy material with metal nanoparticles or microparticles suspended therein. In example embodiments, the conductive ink 114 may have silver (Ag) nanoparticles suspended therein. In other example embodiments, the conductive ink 114 may have nanoparticles of copper, tin, iron, gold, combinations thereof, or the like, suspended therein. In some embodiments, the conductive ink 114 may have suspended therein non-metallic electrically conductive particles. In addition to having conductive materials in the conductive ink 114, there may further be other chemical agents to tune the physical, electrical, and/or processing properties of the conductive ink 114. In example embodiments, the conductive ink 114 may have solvents that may allow the conductive ink 114 to have a viscosity that may be relatively preferential for trench filling, while providing a relatively quick increase in viscosity and/or tackiness for staging in the trenches 112. In same or other example embodiments, the conductive ink 114 may have reducing agents to prevent or reduce oxidation of metal particles that may be suspended in the conductive ink 114. Further still, the conductive ink 114 may contain filler particles (e.g., carbon fibers, silica particles, ceramics, etc.) in proportions that provide the conductive ink 114 with desirable properties, such as a preferred range of viscosity, a preferred range of tackiness, a preferred range of hydrophobicity (e.g., surface wetting), a preferred range of particle suspension properties, a preferred range of cure temperatures, combinations thereof, or the like.

Although in FIG. 1E the surface of the epoxy 110 is shown to be free of any of the conductive ink 114, it will be appreciated that in accordance with example embodiments, there may be residual conductive ink 114 on the top surface of the epoxy 110. In some cases, a clean and/or scrubbing process may be used to remove residual conductive ink 114 from the surface of the epoxy 110. In other cases, the residual conductive ink 114 may remain on top of the epoxy 110 during subsequent processes. In some example embodiments, the conductive ink 114 may be engineered such that it promotes adhesion between a subsequent metal laminate material on top of the epoxy 110 and/or the conductive ink 114.

Figure 1F:
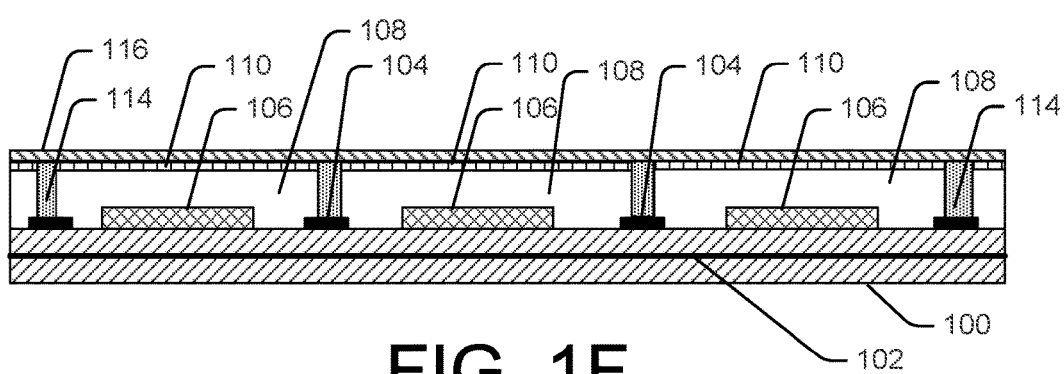

FIG. 1F depicts a schematic cross-section of the example semiconductor package substrate 100 with conductive ink 114 filling the trenches 112 within the molding 108 of FIG. 1E with a metal laminate provided thereon, in accordance with example embodiments of the disclosure. A metal sheet 116 may be laminated on top of the epoxy 110. The metal sheet 116, or metal laminate may be of any suitable material. In some example embodiments, the metal sheet 116 may be a copper sheet. In other example embodiments, the metal sheet 116 may be a gold sheet, a tin sheet, a silver sheet, combinations thereof, or the like. The metal sheet may be of any suitable thickness. In example embodiments, the metal sheet 116 may be approximately in a range of about 25 μm to about 500 μm.

The metal sheet 116 may be laminated on top of the epoxy 110 by any suitable process, including, for example, cold roll or hot roll. In example embodiments, the metal sheet 116 may be hot pressed on top of the epoxy 110 at a temperature and pressure such that the lamination is performed concurrently with curing the epoxy 110 (epoxy that may be at a B stage). In example embodiments, the conductive ink 114 may further be hardened and/or cured during the lamination process. In other words, at the conclusion of forming the metal laminate on top of the epoxy 110, the epoxy 110 and the conductive ink 114 may be in its final composition of the semiconductor package with EMI shielding.

Figure 1G:
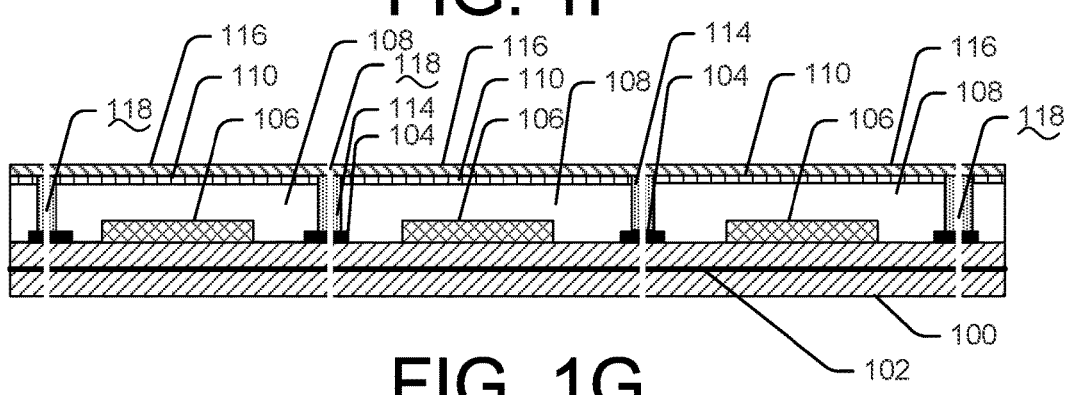

FIG. 1G depicts a schematic cross-section of the example semiconductor package with the EMI shielding of FIG. 1E that has been singulated to form individual semiconductor packages with EMI shielding, in accordance with example embodiments of the disclosure. The individual semiconductor packages, as fabricated on the semiconductor package substrate 100, may be singulated by cutting through the edges of each individual semiconductor package to provide a separation 118 therebetween. The singulation may be performed using laser ablation, saw, or any other suitable mechanism. In example embodiments where laser ablation is used, the ablation width between the adjacent semiconductor packages may be less than the width of the conductive ink 114 filled trenches between the adjacent semiconductor packages. In other example embodiments, where a saw cut is implemented, the kerf width between the adjacent semiconductor packages may be less than the width of the conductive ink 114 filled trenches between the adjacent semiconductor packages. In these example embodiments, where the singulation width of the cut between the semiconductor package is less than the width of the conductive ink filled trenches, the singulated semiconductor package will have conductive ink (e.g., cured conductive ink) on its sidewall (e.g., along its perimeter). This conductive ink sidewall may be grounded (e.g., electrically connected to the surface ground pads 104 that are further connected to ground plane layer 102) to form the sidewall portion of the EMI shielding of the semiconductor package. The top of the EMI shielding may be formed by the metal laminate that may be electrically connected to the sidewall conductive ink of each of the singulated semiconductor packages.

It will be appreciated that the processes as described in conjunction with FIGS. 1A-1G may form an electromagnetic shield surrounding one or more electronic components 106 disposed on the surface of a semiconductor package. The EMI shielding may have a top portion formed from the laminated metal sheet 116 disposed on top of the molding 108 that encapsulates the electronic components 106. The sidewalls of the semiconductor package may further have EMI shielding in the form of conductive ink sidewalls along the periphery and from top to bottom of the semiconductor package. Additionally, there may be vertical portions (e.g., conductive ink filled trenches) that are not along the periphery of these singulated semiconductor packages with EMI shielding. In these cases, in an SiP configuration, some electronic components 106 on the semiconductor package may be shielded from other electronic components on the semiconductor package. For example, an amplifier of a relatively high frequency signal may be isolated from other electronic components on the semiconductor package using the vertical portions of the EMI shielding to prevent the amplifier from injecting electromagnetic noise into other components of the SiP.

In alternative embodiments, it will be appreciated that the conductive ink 114 itself may serve the role of the epoxy 110 for the purposes of adhering the metal laminate 116. In this case, if the conductive ink 114 both acts as an adhesive and fills the trenches 112, then the epoxy deposition process may be avoided and the metal laminate 116 may be provided directly on a layer of conductive ink 114 on top of the molding 108. It will be appreciated that such a process sequence may save one or more processes in the formation of the semiconductor package with EMI shielding.

In further alternative embodiments, the conductive ink 114 may be deposited in a manner such that there is a coating of conductive ink 114 on top of the molding 108. In these example embodiments, the epoxy 110 and/or the metal laminate may not be used, since the conductive ink 114 may provide a conductive material on the top of the molding of the semiconductor package that may be shorted to ground and, thus, may serve as an EMI shield. Implementing this embodiment may make use of a relatively higher viscosity conductive ink. In example embodiments, if a relatively higher viscosity conductive ink is used for forming the top of the EMI shield, then the conductive ink may have poorer gap filling properties, in which case, a relatively wider trench may be used in the molding material to construct the vertical portions of the EMI shield.

FIGS. 2A-2H depict simplified cross-sectional schematic diagrams illustrating various semiconductor packages 200, 218, 222, 226, 230, 236, 242, 248 with EMI shielding, in accordance with example embodiments of the disclosure. While FIGS. 2A-2H describe various embodiments of the semiconductor package with EMI shielding, in accordance with example embodiments of the disclosure, it will be appreciated that these embodiments are examples and the disclosure is not, in any way, limited by the variations described in FIGS. 2A-2H.

FIG. 2A is a simplified cross-sectional schematic diagram illustrating a semiconductor package 200 fabricated according to the processes of FIGS. 1A-1G, in accordance with example embodiments of the disclosure. The semiconductor package 200 includes a package substrate 202, a ground plane 204, surface ground pads or traces 206, an electronic component 208, molding 210 encapsulating the electronic component 208, epoxy 212 on a top surface of the molding 210, a metal laminate 214 on the top of the semiconductor package, and a conductive ink-based conductive sidewall 216.

FIG. 2B is a simplified cross-sectional schematic diagram illustrating a semiconductor package 218 with conductive ink-based conductive sidewalls 220 that extend down to the ground plane 204, in accordance with example embodiments of the disclosure. In this example embodiment, there may be relatively fewer, compared to semiconductor package 200 of FIG. 2A, or no surface ground pad connections of the conductive sidewall 220. In this example embodiment, the trench formation may be such that the trench is formed into the package substrate 202 until the trench lands on the ground plane 204 layer. In this case, the semiconductor package 218 design rules may be such that the interconnect layers overlying the regions where the conductive sidewall 220 extends down to the ground plane 204 may have exclusion regions without circuitry to allow the conductive sidewalls 220 to extend into the package substrate 202.

FIG. 2C is a simplified cross-sectional schematic diagram illustrating a semiconductor package 222 with conductive ink-based conductive sidewalls 224 where the surface ground pads or traces 206 are on the surface of the package substrate 202, in accordance with example embodiments of the disclosure. In this embodiment, there may not be a ground plane within the interconnect layers of the package substrate.

FIG. 2D is a simplified cross-sectional schematic diagram illustrating a semiconductor package 226 with conductive ink-based conductive sidewalls 228 that extend past a ground plane layer and to a bottom side of the package substrate 202, in accordance with example embodiments of the disclosure. In this example embodiment, the conductive sidewall 228 may be such that electrical contact is made with the ground plane 204. In this case, the semiconductor package 226 design rules may be such that the interconnect layers overlying and underlying the regions where the conductive sidewall 228 extends down along the full thickness of the package substrate 202 may have exclusion regions without circuitry to allow the conductive sidewalls 228 to extend through the package substrate 202.

FIG. 2E is a simplified cross-sectional schematic diagram illustrating a semiconductor package 230 with conductive ink-based conductive sidewalls 232 and a conductive ink-based top portion 234 of the EMI shielding, in accordance with example embodiments of the disclosure. In this semiconductor package 230, the ground plane may be electrically connected to the conductive sidewalls 232 and conductive top 234 of the EMI shielding via surface ground pads and/or traces 206 on the surface of the package substrate 202. As discussed above, in example embodiments, the top portion 234 of the EMI shielding may be fabricated by the conductive ink or conductive paste by having conductive ink puddle over the top of the molding 210 when gap filling the trenches formed in the molding 210. Alternatively, a gap filling conductive ink process may be performed, followed by a second top conductive ink deposition process. In this example embodiment, a less viscous conductive ink may be utilized in the conductive ink gap filling process for relatively good gap filling performance, and a relatively more viscous conductive ink may be used in the top conductor deposition process to enhance tackiness.

FIG. 2F is a simplified cross-sectional schematic diagram illustrating a semiconductor package 236 with conductive ink-based conductive sidewalls 238 that extend down to the ground plane 204 and a conductive ink-based top portion 240 of the EMI shielding, in accordance with example embodiments of the disclosure. In this embodiment of the semiconductor package with EMI shielding, the trenches for forming the conductive sidewalls 238 of the EMI shielding may be formed such that they extend through the molding, as well as build-up layers on top of the package substrate 202. In this embodiment, the semiconductor package 236 design rules may be such that the interconnect layers overlying the regions where the conductive sidewall 238 extends down to the ground plane 204 may have exclusion regions without circuitry to allow the conductive sidewalls 238 to extend into the package substrate 202. In example embodiments, the top portion 240 of the EMI shielding may be fabricated by the conductive ink or conductive paste by having conductive ink puddle over the top of the molding 210 when gap filling the trenches formed in the molding 210. Alternatively, a gap filling conductive ink process may be performed, followed by a second top conductive ink deposition process. In this example embodiment, a less viscous conductive ink may be utilized in the conductive ink gap filling process for relatively good gap filling performance, and a relatively more viscous conductive ink may be used in the top conductor deposition process to enhance tackiness.

FIG. 2G is a simplified cross-sectional schematic diagram illustrating a semiconductor package 242 with conductive ink-based conductive sidewalls 244 and a conductive ink-based top portion 246 of the EMI shielding, where the surface ground pads or traces 206 are on the surface of the package substrate 202, in accordance with example embodiments of the disclosure. In example embodiments, the top portion 246 of the EMI shielding may be fabricated by the conductive ink or conductive paste by having conductive ink puddle over the top of the molding 210 when gap filling the trenches formed in the molding 210. Alternatively, a gap filling conductive ink process may be performed, followed by a second top conductive ink deposition process. In this example embodiment, a less viscous conductive ink may be utilized in the conductive ink gap filling process for relatively good gap filling performance, and a relatively more viscous conductive ink may be used in the top conductor deposition process to enhance tackiness.

FIG. 2H is a simplified cross-sectional schematic diagram illustrating a semiconductor package 248 with conductive ink-based conductive sidewalls 250 and a conductive ink-based top portion 252 of the EMI shielding, in accordance with example embodiments of the disclosure. In example embodiments, the top portion 252 of the EMI shielding may be fabricated by the conductive ink or conductive paste by having conductive ink puddle over the top of the molding 210 when gap filling the trenches formed in the molding 210. Alternatively, a gap filling conductive ink process may be performed, followed by a second top conductive ink deposition process. In this example embodiment, a less viscous conductive ink may be utilized in the conductive ink gap filling process, and a relatively more viscous conductive ink may be used in the top conductor deposition process.

FIGS. 3A and 3B depict simplified cross-sectional schematic diagrams illustrating semiconductor packages 300, 320 with multiple dies provided therein with EMI shielding, in accordance with example embodiments of the disclosure.

FIG. 3A depicts a simplified cross-sectional schematic diagram illustrating a semiconductor package 300 with EMI shielding having a stacked die configuration. Although two dies (e.g., integrated circuits) 308, 310 are depicted here, it will be appreciated that there may be any suitable number of dies that are stacked within the semiconductor package 300. As shown, the first die 308 may be disposed on the package substrate 302. The package substrate 302 may have a ground build-up layer 304 and surface groundpads or traces 306. The first die 308 may be electrically and mechanically attached to the package substrate by any suitable mechanism including, but not limited to, metal pillars (e.g., copper pillars), flip chip bumps, solder bumps, any type of low-lead or lead-free solder bumps, tin-copper bumps, wire bonds, wedge bonds, C4, ACF, NCF, combinations thereof, or the like.

The second die 310 may be aligned and attached to top of the first die 308. In some example embodiments, the second die 310 may be attached to the first die 308 in a face-down configuration and, in alternative embodiments, the second die 310 may be attached to the first die 308 in a face-up configuration. In the case where the second die 310 is disposed in a face-down configuration, the first die 308 may be in a face-up configuration, and all of the input/output (I/O) connections of the second die 310 may be to the first die 308 in face-to-face connections. In this configuration, I/O signals from the second die 310 may be evacuated via the first die 308, such as via wire bond connections from the first die 308 to the package substrate 302. Alternatively, when the second die 310 is disposed in a face-down configuration, the first die 308 may also be in a face-down configuration and may have through silicon vias (TSVs) to connect the I/O of the second die 310 via the TSVs in the first die 308 to the package substrate 302. In other example embodiments, the both die 308, 310 may be disposed in a face-up configuration and the I/O connections both dies 308, 310 may be made using wire bonding from each die 308, 310 to pads on the package substrate 302 and/or between the second die 310 and the first die 308. In some example embodiments, both TSV-based and wire bond connections may be made for one or both of the dies 308, 310. In yet other example embodiments, one of the dies 308, 310 may be an interposer die for the purposes of making high density connections, providing greater fan-out ratio, and/or providing relatively more reliable I/O connections.

Continuing with FIG. 3A, the semiconductor package 300 may have molding 314 that encapsulates the dies 308, 310. There may further be a conductive sidewall 312 along the periphery of the semiconductor package 300. The conductive sidewall 312, as described above, may be formed by cured conductive ink and/or conductive paste. The semiconductor package 300 may further include an epoxy layer 316 for attaching a metal laminate 318 to the top surface of the molding 314. The combination of the conductive sidewall 312 and the top metal laminate 318 electrically connected to surface ground pads 306 provide an EMI shielding, in accordance with example embodiments of the disclosure.

FIG. 3B depicts a simplified cross-sectional schematic diagram illustrating a semiconductor package 320 with EMI shielding having a laterally disposed die configuration. Although two dies (e.g., integrated circuits) 322, 324 are depicted here, it will be appreciated that there may be any suitable number of dies that are provided within the semiconductor package 320. As shown, both the first die 322 and the second die 324 may be disposed on the package substrate 302 and may be encapsulated by molding 314. The package substrate 302 may have a ground build-up layer 304 and surface ground pads or traces 306. The first die 322 and the second die 324 may be electrically and mechanically attached to the package substrate 302 by any suitable mechanism including, but not limited to metal pillars (e.g., copper pillars), flip chip bumps, solder bumps, any type of low-lead or lead-free solder bumps, tin-copper bumps, wire bonds, wedge bonds, C4, ACF, NCF, combinations thereof, or the like. It will be appreciated that in some cases both dies 322, 324 may be attached to the substrate using the same mechanism and, in other cases, the dies 322, 324 may be attached using different mechanisms. There may be a conductive sidewall 312 along the periphery of the semiconductor package 320. The conductive sidewall 312, as described above, may be formed by cured conductive ink and/or conductive paste. The semiconductor package 320 may further include an epoxy layer 316 for attaching a metal laminate 318 to the top surface of the molding 314. The combination of the conductive sidewall 312 and the top metal laminate 318 electrically connected to surface ground pads 306 provide an EMI shielding, in accordance with example embodiments of the disclosure.

FIGS. 4A and 4B depict simplified cross-sectional schematic diagrams illustrating semiconductor packages 400, 430 having any variety of electrical and mechanical coupling between the die and the semiconductor package having an EMI shield, in accordance with example embodiments of the disclosure.

FIG. 4A depicts a simplified cross-sectional schematic diagram illustrating a semiconductor package 400 having a die 416 that is attached to a package substrate 402 using copper pillars 418. The package substrate 402 may have a ground plane 404 and one or more ground pad contacts 406 provided on the surface of the package substrate 402. The die 416 may be encapsulated by the molding 408, and there may be conductive sidewalls 414 and a conductive top 412 attached to the molding 408 with epoxy 410, where the conductive sidewalls 414 and the conductive top 412 are shorted to the surface ground pad contacts 406 to form the EMI shielding, as described herein.

The copper pillars 418 may be of any suitable size. For example, the copper pillars 418 may be approximately in the range of about 10 μm to about 150 μm in width. The die 416 may be aligned and attached to the semiconductor substrate by any suitable mechanisms. For example, a thermosonic process may be used to fuse the copper pillars 418 to corresponding pads on the package substrate using gold/nickel, tin/lead, or any suitable metallurgy. As another example embodiment, a wave soldering process may be used to attach the die 416 to the package substrate 402. In example embodiments, underfill material 420 may be provided around the copper pillars 418, between the die 416 and the package substrate 402. Representative epoxy materials in the underfill 420 may include an amine epoxy, imidizole epoxy, a phenolic epoxy or an anhydride epoxy. Other examples of underfill material include polyimide, benzocyclobutene (BCB), a bismaleimide type underfill, a polybenzoxazine (PBO) underfill, or a polynorbornene underfill. Additionally, the underfill material 420 may include a filler material, such as silica. Underfill material 420 may be introduced by spin coating, extrusion coating or spray coating techniques. In another embodiment, the underfill material 420 includes a standard fabrication passivation material such as an inorganic passivation material (e.g., silicon nitride, silicon oxynitride) or organic passivation material (e.g., polyimide).

The package substrate 402, as described above, may have build-up layers on either side of the substrate core. In some cases, a coreless package substrate 402 may be used. In example embodiments, contacts 422 for package level I/O may be provided on the package substrate 402. The contacts 422 may be any suitable contacts, such as ball grid array (BGA) or other area array contacts 422.

FIG. 4B depicts a simplified cross-sectional schematic diagram illustrating a semiconductor package 430 having two dies 432, 434 that are attached to a package substrate 402 using wire bonds 436, 438, in accordance with example embodiments of the disclosure. The package substrate 402 may have a ground plane 404 and one or more ground pad contacts 406 provided on the surface of the package substrate 402. The dies 432, 434 may be encapsulated by molding 408 and there may be conductive sidewalls 414 and a conductive top 412 attached to the molding 408 with epoxy 410, where the conductive sidewalls 414 and the conductive top 412 are shorted to the surface ground pad contacts 406 to form the EMI shielding, as described herein. In example embodiments, contacts 422 for package level I/O may be provided on the package substrate 402. The contacts 422 may be any suitable contacts, such as ball grid array (BGA) or other area array contacts 422.

Figure 5:
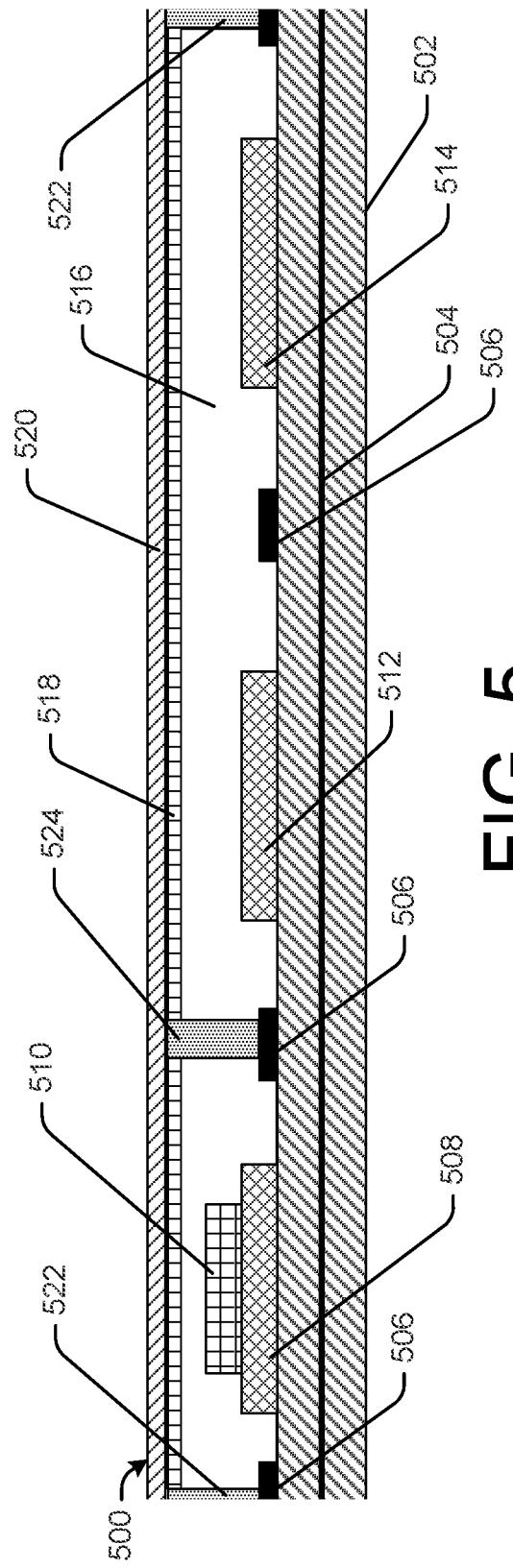
FIG. 5 depicts a simplified cross-sectional schematic diagram illustrating a system in a package (SiP) with EMI shielding around one or more electronic components, in accordance with example embodiments of the disclosure.

FIG. 5 depicts a simplified cross-sectional schematic diagram illustrating a system in a package (SiP) 500 with EMI shielding around one or more electronic components 508, 510, 512, 514, in accordance with example embodiments of the disclosure. The SiP 500 may have a package substrate 502 with a ground plane 504 and one or more surface ground pads and/or traces 506. The electronic components 508, 510, 512, 514 may be provided in any suitable configuration and with any suitable electrical connections to the package substrate. For example, electronic components 508 and 510 are disposed in a stacked configuration. The SiP 500 may have molding 516 encapsulating the electronic components 508, 510, 512, 514. The SiP 500 may further have vertical conductive structures 522, 524 disposed in the molding. These vertical conductive structures 522, 524 may be cured conductive ink and/or conductive paste. Thus, upon curing, the vertical conductive structures 522, 524 may have epoxy with conductive particles disposed therein. This conductive epoxy may form vertical portions of an EMI shielding structure. The SiP 500 may further include a metal sheet 520 disposed on top of the molding 516. The metal sheet 520 may be laminated on to the top surface of the molding 516 and may be attached using a layer of epoxy 518. The metal sheet 520 may be electrically connected to the vertical conductive structures 522, 524 and to the surface ground pads and/or traces 506. According to example embodiments of the disclosure, some of the vertical conductive structures 522, 524 may be sidewall conductive structures 522 on the periphery of the semiconductor package and other vertical conductive structures 524 may be internal vertical conductive structures to prevent EMI between the electronic components 508, 510, 512, 514 provided in the same SiP 500. For example, vertical conductive structure 524 may isolate EMI resulting from the combination of electronic components 508, 510 from electronic components 512, 514.

Figure 6:
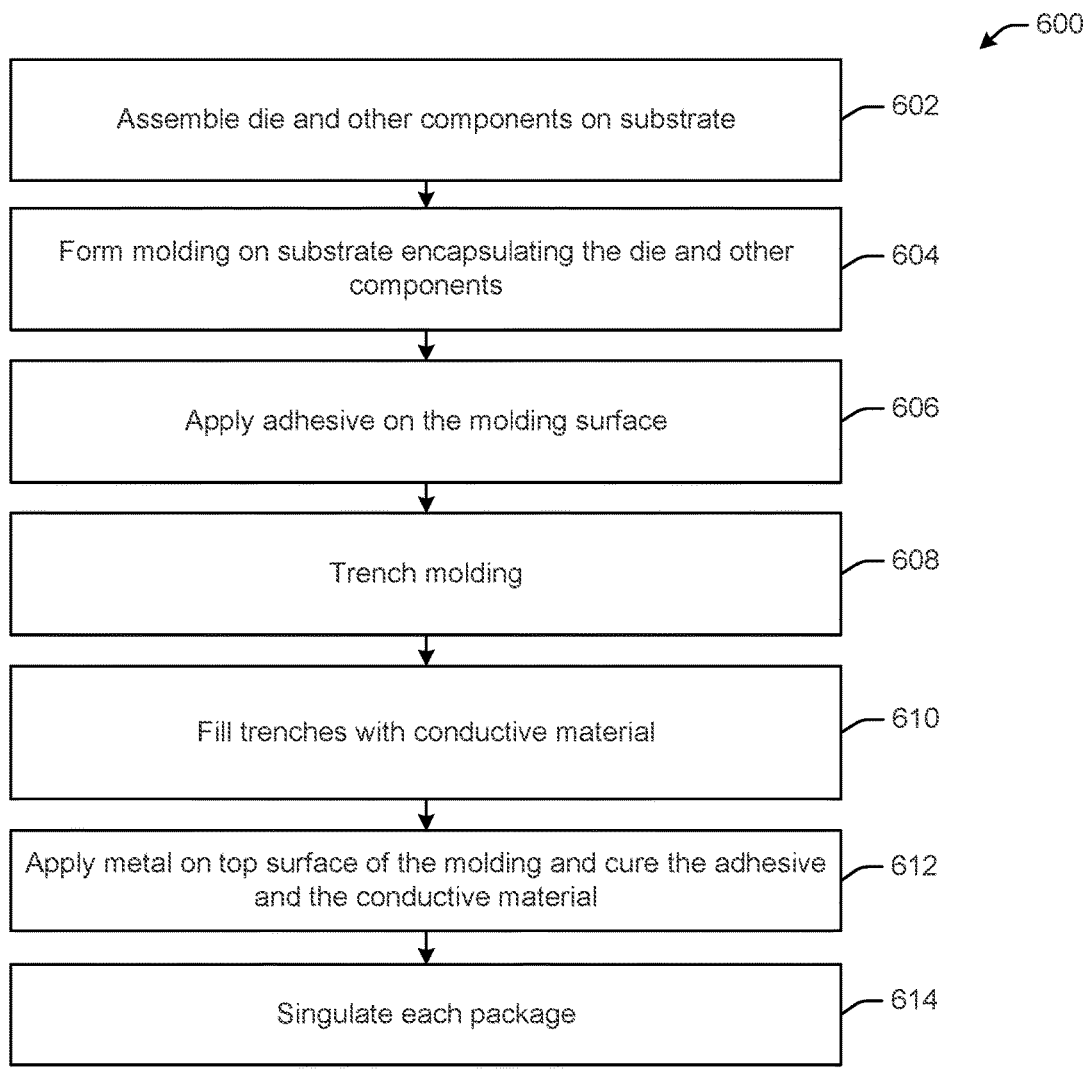
FIG. 6 depicts a flow diagram illustrating an example method for fabricating the semiconductor packages of FIGS. 1-5, in accordance with example embodiments of the disclosure.

FIG. 6 depicts a flow diagram illustrating an example method for fabricating the semiconductor packages of FIGS. 1-5, in accordance with example embodiments of the disclosure. At block 602, a die and other components may be assembled on a substrate. At this point, the substrate may be a substrate panel on which multiple semiconductor packages are fabricated concurrently or nearly concurrently. The substrate (e.g., in panel form) may have build-up layers formed thereon and may be at a stage where the die and/or other structures may be formed thereon. The die may be any suitable electronic device, such as a semiconductor-based electronic device. In example embodiments, the die may be an integrated circuit (IC) with at least one active device (e.g., transistors, diodes, etc.) and/or passive device (e.g., resistors, inductors, capacitors, etc.).

At block 604, molding that may encapsulate the die and other components may be formed on the substrate. Forming the molding may entail depositing a molding compound to a sufficient thickness to encapsulate the die and/or other components on the surface of the substrate. In example embodiments, the molding compound may be a thermosetting compound. In some cases, the molding compound may have one or more filler materials provided therein to engineer various physical, electrical, and/or thermal properties of the molding. After depositing the molding compound, a cure process may be performed to cross-link and/or harden the molding compound to form the molding.

At block 606, adhesive may be applied on the molding surface. The adhesive may, in example embodiments, be a thermosetting epoxy. The adhesive may be used for the purpose of laminating the top metal sheet onto the top of the molding material. The adhesive may be deposited by any variety of suitable mechanism including, but not limited to, spin coating, spray coating, squeegee, screen printing, combinations thereof, or the like.

At block 608, trenches may be formed in the molding. The trenches may be formed by any variety of mechanisms, such as laser ablation, wet etching, dry etching, or any combination thereof. When using a dry and/or wet etching mechanism for forming the trenches, a patterning (e.g., photolithography, screen printing, etc.) process may be performed to define the portions where the trenches are to be formed.

At block 610, the trenches may be filled with conductive material. In example embodiments, the conductive material may be conductive ink and/or conductive paste. The conductive ink or conductive paste may be an epoxy material with conductive particles provided (e.g., suspended) therein. The conductive ink and/or conductive paste may include other materials therein, such as reducing agents, fillers, etc. In example embodiments, the conductive ink and/or conductive paste may be deposited by a spin-on, spray-on, squeegee, and/or screen printing process. In some cases (e.g., screen printing), the deposition of the conductive ink and/or conductive paste may be in and/or near the molding trenches that are to be filled. In some cases, the conductive ink and/or conductive paste may be a thixotropic material and, thus, may preferentially flow into the trenches and then stage in a relatively more rigid form.

At block 612, metal may be applied on the top surface of the molding while curing the adhesive and the conductive material. In some example embodiments, the curing of the conductive ink (or conductive paste), along with curing the adhesive (e.g., B-stage epoxy) may be performed contemporaneously. In example embodiments, the metal may be applied as a lamination sheet, such as a thin sheet of copper. The lamination temperature to laminate the metal sheet and cure the epoxy and the conductive ink may be approximately in the range of about 100° C. to about 250° C. In some example embodiments, the lamination temperature may be approximately in the range of about 150° C. to about 175° C.

At block 614, each of the packages may be singulated. The singulation may be performed by any suitable mechanism, such as by laser ablation or saw cut. If laser ablation is used, then the cut width may be smaller than the width of the filled trenches. In this way, when the semiconductor packages are singulated from each other by cutting the semiconductor substrate panel, the conductive material (e.g., cured conductive ink, cured conductive paste, etc.) may remain on both sides of the cut and provide a conductive sidewall of an EMI shield on adjacent semiconductor packages, in accordance with example embodiments of the disclosure.

It should be noted that the method 600, as disclosed herein, may enable a relatively reliable mechanism for fabricating the electromagnetic interference shield of the semiconductor package. The use of conductive ink and metal laminate for the EMI shield may provide for a relatively more cost-effective mechanism for the fabrication of the EMI shield compared to other methods, such as physical vapor deposition (PVD) of conductive material. Additionally, the formation of trenches within the molding and filling those trenches with relatively more compliant material may provide for stress relief and other mechanisms for improved reliability of the semiconductor package compared to other methods of forming EMI shields.

It should be noted, that the method 600 may be modified in various ways in accordance with certain embodiments of the disclosure. For example, one or more operations of the method 600 may be eliminated or executed out of order in other embodiments of the disclosure. Additionally, other operations may be added to the method 600 in accordance with other embodiments of the disclosure.

It will be appreciated that the apparatus described herein may be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided in the semiconductor packages with EMI shielding, as described herein. For example, microcontrollers, microprocessors, baseband processors, digital signal processors, memory dies, field gate arrays, memory dies, logic gate dies, passive component dies, MEMSs, surface mount devices, application specific integrated circuits, baseband processors, amplifiers, filters, combinations thereof, or the like may be packaged in the semiconductor packages with EMI shielding, as disclosed herein. The semiconductor packages with EMI shielding, as disclosed herein, may be provided in any variety of electronic devices including, consumer, industrial, military, communications, infrastructural, and/or other electronic devices.

The semiconductor package with EMI shielding, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system, and the one or more processors and any chipsets included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package with EMI shielding, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package with EMI shielding is provided may be a computing device. Such a computing device may house one or more boards on which the semiconductor package with EMI shielding may be disposed. The board may include a number of components, including but not limited to a processor and/or at least one communication chip. The processor may be physically and electrically connected to a board through, for example, electrical connections of the semiconductor package with EMI shielding. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices, or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

According to example embodiments of the disclosure, there may be a microelectronics package, comprising a substrate having a top substrate surface and a substrate outer periphery, the top substrate surface having an electronic component mounted thereon and the top substrate surface having a conductive trace along at least a portion of the substrate outer periphery; a molding compound provided over the top substrate surface, having a bottom molding surface, a top molding surface, and a molding sidewall substantially overlying the substrate outer periphery; a metallic sheet provided on top of the top molding surface; and epoxy provided on the molding sidewall, wherein the epoxy includes conductive particles, and wherein the epoxy is electrically coupled to the metallic sheet. In example embodiments, the epoxy is further electrically coupled to the conductive trace. In further example embodiments, the conductive trace is electrically connected to at least one of: (i) ground, (ii) a direct current (DC) voltage, or (iii) a power line voltage of the microelectronics package. In yet further example embodiments, the substrate includes a core layer and at least one build-up layer having metal lines, wherein the metal lines include at least the conductive trace.

According to some example embodiments, the molding compound of the microelectronics package comprises a thermosetting epoxy compound. In further example embodiments, the epoxy is a first epoxy, and wherein the microelectronics package includes a second epoxy disposed between the top molding surface and the metallic sheet. In still further example embodiments, the metal sheet comprises a laminate copper sheet, and wherein the laminate copper sheet adheres to the top molding surface by the second epoxy. In yet further example embodiments, the epoxy comprises at least one of: (i) cured conductive ink, (ii) cured conductive paste, or (iii) silver nanoparticles. Further still, in example embodiments, the electronic component is a first electronic component, and wherein the microelectronics package further comprises a second electronic component; and a vertical conductive structure electrically connected to the conductive trace and the metallic sheet, and disposed between the first electronic component and the second electronic component in a trench formed in the molding extending from the bottom molding surface to the top molding surface. In some example embodiments, the microelectronics package comprises a plurality of package-to-board electrical connections disposed on a bottom substrate surface of the substrate.

According to example embodiments of the disclosure, there may be a method comprising providing a package substrate panel with a panel top surface; electrically attaching a first electronic component and a second electronic component to the panel top surface; forming a molding on the panel top surface, the molding having a bottom molding surface contacting the panel top surface and a top molding surface, wherein the molding encapsulates the first electronic component and the second electronic component; depositing a first epoxy on the top molding surface; forming a plurality of trenches in the molding, each of the plurality of trenches extending from the bottom molding surface to the top molding surface; filling the plurality of trenches with a second epoxy, wherein the second epoxy comprises conductive particles; laminating a metal sheet over the first epoxy; and singulating a portion of the package substrate panel through a first of the plurality of filled trenches and an underlying portion of the package substrate panel. In further example embodiments, the package substrate panel includes an electrical trace on the panel top surface, and wherein forming the plurality of trenches comprises removing molding from at least a part of a surface of the electrical trace. In still further example embodiments, the first of the plurality of filled trenches is disposed between the first electronic component and the second electronic component, and wherein the portion of the package substrate panel includes the first electronic component and not the second electronic component.

According to example embodiments of the disclosure, the method may be such that the portion of the package substrate panel includes a third electronic component, and wherein there is a second of the plurality of filled electrical trenches disposed between the first electronic component and the third electronic component. In further example embodiments, attaching a first electronic component to the panel top surface comprises bonding copper pillars of the first electronic component onto one or more pads on the panel top surface. In still further example embodiments, forming the molding comprises depositing liquid molding epoxy on the panel top surface; and applying pressure and heat using a chase to drive cross-linking of the liquid molding epoxy to form the molding. In yet further example embodiments, forming the plurality of trenches comprises at least one of: (i) laser ablating the plurality of trenches, (ii) dry etching the plurality of trenches, or (iii) wet etching the plurality of trenches. In some example embodiments, filling the plurality of trenches with the second epoxy comprises at least one of: (i) spin coating the second epoxy, (ii) spray coating the second epoxy, (iii) squeegeeing the second epoxy, or (iv) screen printing the second epoxy, and wherein the second epoxy is one of: (i) conductive ink, or (ii) conductive paste. In these and other embodiments, laminating the metal sheet over the first epoxy comprises heating and curing the first epoxy and the second epoxy. According to example embodiments of the disclosure, singulating the portion of the package substrate panel through the first of the plurality of filled trenches and the underlying portion of the package substrate panel comprises cutting through the filled trench and the underlying portion of the package substrate panel, the cut having a cut width, wherein the cut width is less than a width of the first of the plurality of filled trenches.

The claimed invention is:

1. A microelectronics package, comprising:
a substrate having a top substrate surface and a substrate outer periphery, the top substrate surface having an electronic component mounted thereon and the top substrate surface having a conductive trace along at least a portion of the substrate outer periphery;
a molding compound provided over the top substrate surface, having a bottom molding surface, a top molding surface, and a molding sidewall substantially overlying the substrate outer periphery;
a metallic sheet provided over the top molding surface; and
epoxy provided on the molding sidewall, wherein the epoxy includes conductive particles, and wherein the epoxy is electrically coupled to the metallic sheet, wherein the electronic component is a first electronic component, and wherein the microelectronics package further comprises:
a second electronic component; and
a conductive structure electrically connected to the conductive trace and the metallic sheet, and disposed between the first electronic component and the second electronic component in a trench formed in the molding extending from the bottom molding surface to the top molding surface.

2. The microelectronics package of claim 1, wherein the epoxy is further electrically coupled to the conductive trace.

3. The microelectronics package of claim 2, wherein the conductive trace is electrically connected to at least one of: (i) ground, (ii) a direct current (DC) voltage, or (iii) a power line voltage of the microelectronics package.

4. The microelectronics package of claim 1, wherein the substrate includes a core layer and at least one build-up layer having metal lines, wherein the metal lines include at least the conductive trace.

5. The microelectronics package of claim 1, wherein the molding compound comprises a thermosetting epoxy compound.

6. The microelectronics package of claim 1, wherein the epoxy is a first epoxy, and wherein the microelectronics package includes a second epoxy disposed between the top molding surface and the metallic sheet.

7. The microelectronics package of claim 6, wherein the metal sheet comprises a laminate copper sheet, and wherein the laminate copper sheet adheres to the top molding surface by the second epoxy.

8. The microelectronics package of claim 1, wherein the epoxy comprises at least one of: (i) cured conductive ink, (ii) cured conductive paste, or (iii) silver nanoparticles.

9. The microelectronics package of claim 1, further comprising a plurality of package-to-board electrical connections disposed on a bottom substrate surface of the substrate.

10. A method, comprising:
providing a package substrate panel with a panel top surface;
electrically attaching a first electronic component and a second electronic component to the panel top surface;
forming a molding on the panel top surface, the molding having a bottom molding surface contacting the panel top surface and a top molding surface, wherein the molding encapsulates the first electronic component and the second electronic component;
depositing a first epoxy on the top molding surface;
forming a plurality of trenches in the molding, each of the plurality of trenches extending from the bottom molding surface to the top molding surface;
filling the plurality of trenches with a second epoxy, wherein the second epoxy comprises conductive particles;
laminating a metal sheet over the first epoxy; and
singulating a portion of the package substrate panel through a first of the plurality of filled trenches and an underlying portion of the package substrate panel.

11. The method of claim 10, further comprising singulating a portion of the package substrate panel through a first of the plurality of filled trenches and an underlying portion of the package substrate panel.

12. The method of claim 11, wherein singulating the portion of the package substrate panel through the first of the plurality of filled trenches and the underlying portion of the package substrate panel comprises:
cutting through the filled trench and the underlying portion of the package substrate panel, the cut having a cut width, wherein the cut width is less than a width of the first of the plurality of filled trenches.

13. The method of claim 10, wherein the package substrate panel includes an electrical trace on the panel top surface, and wherein forming the plurality of trenches comprises removing molding from at least a part of a surface of the electrical trace.

14. The method of claim 10, wherein the first of the plurality of filled trenches is
disposed between the first electronic component and the second electronic component, and wherein the portion of the package substrate panel includes the first electronic component and not the second electronic component.

15. The method of claim 14, wherein the portion of the package substrate panel includes a third electronic component, and wherein there is a second of the plurality of filled electrical trenches disposed between the first electronic component and the third electronic component.

16. The method of claim 10, wherein attaching the first electronic component to the panel top surface comprises bonding copper pillars of the first electronic component onto one or more pads on the panel top surface.

17. The method of claim 10, wherein forming the molding comprises:
depositing liquid molding epoxy on the panel top surface; and
applying pressure and heat using a chase to drive cross-linking of the liquid molding epoxy to form the molding.

18. The method of claim 10, wherein forming the plurality of trenches comprises at least one of: (i) laser ablating the plurality of trenches, (ii) dry etching the plurality of trenches, or (iii) wet etching the plurality of trenches.

19. The method of claim 10, wherein laminating the metal sheet over the first epoxy comprises heating and curing the first epoxy and the second epoxy.

* * * * *